US012531177B2

(12) United States Patent
Prager et al.

(10) Patent No.: US 12,531,177 B2
(45) Date of Patent: Jan. 20, 2026

(54) HIGH VOLTAGE PULSE GENERATOR FOR HIGH-ENERGY BEAM KICKERS (71) Applicant: Eagle Harbor Technologies, Inc., Seattle, WA (US)

(72) Inventors: James Prager, Seattle, WA (US); Kenneth Miller, Seattle, WA (US); Kevin Muggli, Mountlake Terrace, WA (US); Zach Mulalley, Seattle, WA (US); Caleb Schmidt, Eatonville, WA (US); Steven Wilson, Seattle, WA (US); Huatsern Yeager, Olympia, WA (US)

(73) Assignee: EHT VENTURES, INC., Seattle, WA (US)

( * ) Notice: Subject to any disclaimer, the term of this patent is extended or adjusted under 35 U.S.C. 154(b) by 561 days.

(21) Appl. No.: 18/066,277

(22) Filed: Dec. 14, 2022

(65) Prior Publication Data
US 2023/0187113 A1  Jun. 15, 2023

Related U.S. Application Data (60) Provisional application No. 63/289,584, filed on Dec. 14, 2021.

(51) Int. Cl.
H05K 1/14 (2006.01)
H01F 27/24 (2006.01)
(Continued)

(52) U.S. Cl.
CPC ........... H01F 27/24 (2013.01); H05K 1/0243 (2013.01); H05K 2201/10022 (2013.01); H05K 2201/1003 (2013.01); H05K 2201/10166 (2013.01)

(58) Field of Classification Search
CPC ....... H05K 1/0243; H05K 2201/10022; H05K 2201/1003; H05K 2201/10166; H01F 27/24
See application file for complete search history.

(56) References Cited

U.S. PATENT DOCUMENTS

2002/0140464 A1* 10/2002 Yampolsky .............. H03K 3/57
327/100
2009/0316438 A1* 12/2009 Crewson .............. H03K 17/127
363/16
(Continued)

OTHER PUBLICATIONS

Mi, Y., et al., "A Multiparameter Adjustable, Portable High-Voltage Nanosecond Pulse Generator Based on Stacked Blumlein Multilayered PCB Strip Transmission Line", IEEE Transactions on Plasma Science, vol. 44, No. 10, pp. 2022-2029 (Oct. 2016).
(Continued)

Primary Examiner — Hoa C Nguyen (57) ABSTRACT

A high voltage inductive adder is disclosed. An inductive adder may include a plurality of switch boards that each include a plurality of switch boards that include a plurality of solid state switches. These switch boards may be stacked one upon another. The inductive adder may include a transformer comprising a plurality of toroid-shaped transformer cores disposed on a corresponding one of the plurality of switch boards; and a transformer rod that extends through the plurality of switch boards and the plurality of transformer cores. The inductive adder may include an output electrically coupled with the transformer rod. And each of the plurality of circuit boards, for example, may include a tailbiter circuit electrically coupled in parallel with the output.

21 Claims, 8 Drawing Sheets (51) Int. Cl.
   *H01F 27/28*     (2006.01)
   *H05K 1/02*      (2006.01)

(56)          References Cited

U.S. PATENT DOCUMENTS

2013/0141878 A1*  6/2013   Wu ..................... H01F 27/2852
                                                         361/748
2016/0226470 A1*  8/2016   Hartmann ................ H03K 3/53
2017/0372834 A1* 12/2017   Kawada .................. H01F 27/40
2018/0138801 A1*  5/2018   Chen ................... H01F 27/2804
2018/0226182 A1*  8/2018   Fe ......................... H01F 27/245
2018/0253570 A1   9/2018   Miller et al.
2020/0328739 A1  10/2020   Miller et al.

OTHER PUBLICATIONS

International Search Report and Written Opinion for PCT application No. PCT/US2022/081603, mailed on Jan. 18, 2024, 09 pages.

* cited by examiner

HIGH VOLTAGE PULSE GENERATOR FOR HIGH-ENERGY BEAM KICKERS

GOVERNMENT RIGHTS

This invention was made with government support under DE-SC0021470 awarded by Department of Energy. The government has certain rights in the invention.

BACKGROUND

Producing high voltage pulses with fast rise times and/or fast fall times is challenging. For instance, to achieve a fast rise time (e.g., less than about 50 ns) for a high voltage pulse (e.g., greater than about 10 kV), the slope of the pulse rise must be incredibly steep. Such a steep rise time is difficult to produce. This is especially difficult using standard electrical components in a compact manner.

SUMMARY

A high voltage inductive adder power system is disclosed. An inductive adder may include a plurality of switch boards that each include a plurality of switch boards that include a plurality of solid state switches. These switch boards may be stacked one upon another. The inductive adder may include a transformer comprising a plurality of toroid-shaped transformer cores disposed on a corresponding one of the plurality of switch boards; and a transformer rod that extends through the plurality of switch boards and the plurality of transformer cores. The inductive adder may include an output electrically coupled with the transformer rod. And each of the plurality of circuit boards, for example, may include a tailbiter circuit electrically coupled in parallel with the output.

An inductive adder power system may, for example, meet the needs of a high energy beam kicker (e.g., the Brookhaven National Laboratory (BNL) stripline kicker). An inductive adder power system, for example, may produce fast, high voltage pulses. An inductive adder power system, for example, may produce pulses with one or more of the following characteristics:

The various examples described in the summary and this document are provided not to limit or define the disclosure or the scope of the claims.

DETAILED DESCRIPTION

A high voltage inductive adder power system is disclosed. An inductive adder power system, for example, may produce high voltage pulses with short pulse widths and fast rise times. An inductive adder power system, for example, may produce high voltage pulses with an output voltage of more than about ±10 kV, such as, for example, of about ±50 kV. An inductive adder power system, for example, may produce high voltage pulses with an output voltage having less than about ±5% variation or jiggle at the flattop. An inductive adder power system, for example, may produce high voltage pulses with an output voltage variation of less than about ±2% at the flattop. An inductive adder power system, for example, may produce high voltage pulses with a residual voltage greater than about 500 V, 1 kV, 2.5 kV, 5 kV, 10 kV, etc.

An inductive adder power system, for example, may produce high voltage pulses with an output current of about 5 kamp such as, for example, about 1 kamp.

An inductive adder power system, for example, may produce high voltage pulses with a load impedance of less than about 50Ω.

An inductive adder power system, for example, may produce high voltage pulses with a pulse shape with a rise time less than about 100 ns, 50 ns, or 10 ns. An inductive adder power system, for example, may produce high voltage pulses with a pulse shape having a flattop time less than about 100 ns, 50 ns, 30 ns, 15 ns, 10 ns (e.g., 18 ns) at full width half max (FWHM). An inductive adder power system, for example, may produce high voltage pulses with a pulse shape with a fall time less than about 100 ns, 50 ns, or 10 ns. The rise time and/or fall time, for example, may be measured from 2-98% of pulses.

An inductive adder power system, for example, may produce high voltage pulses with a pulse repetition frequency less than about 500 Hz, 250 Hz, 100 Hz, 10 Hz, 5 Hz during operation. An inductive adder power system, for example, may produce high voltage pulses with a pulse repetition frequency greater than about 1,000 Hz, 500 Hz, 250 Hz, 100 Hz. An inductive adder power system, for example, may produce high voltage pulses with a jitter less than about 10 ns, 5 ns, 1 ns, 0.5 ns, etc. with respect to external clock.

Figure 1:
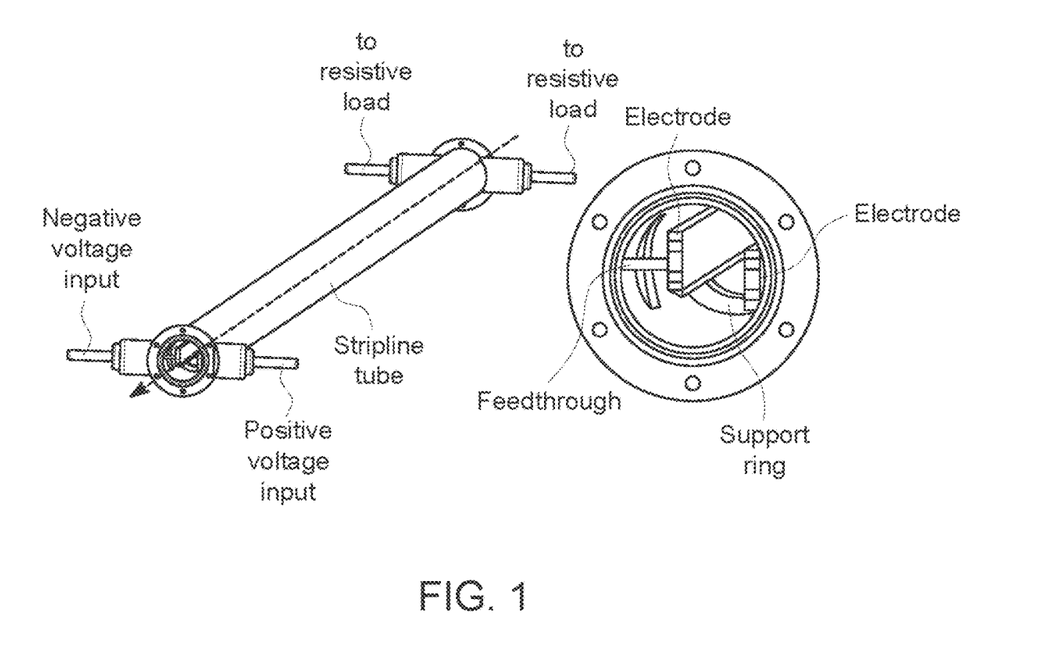
FIG. 1 is an example stripline kicker.

The inductive adder power system may be used with a stripline kicker. FIG. 1 is an example stripline kicker. A stripline kicker, for example, may include two parallel electrodes housed inside a conducting cylinder. Each electrode may be charged by an equal, but opposite polarity, high voltage pulse. The stripline kicker, for example, may be powered by an inductive adder power system, The inductive adder power system, for example, may synch with a controller and/or a master clock input. The controller may allow a user or controller to apply a gate signal that causes the inductive adder power system to output high voltage pulses that are synched with the master clock signal. The controller may, for example, monitor the thermal environment of the inductive adder power system as well as report system health information back to a user.

Figure 2:
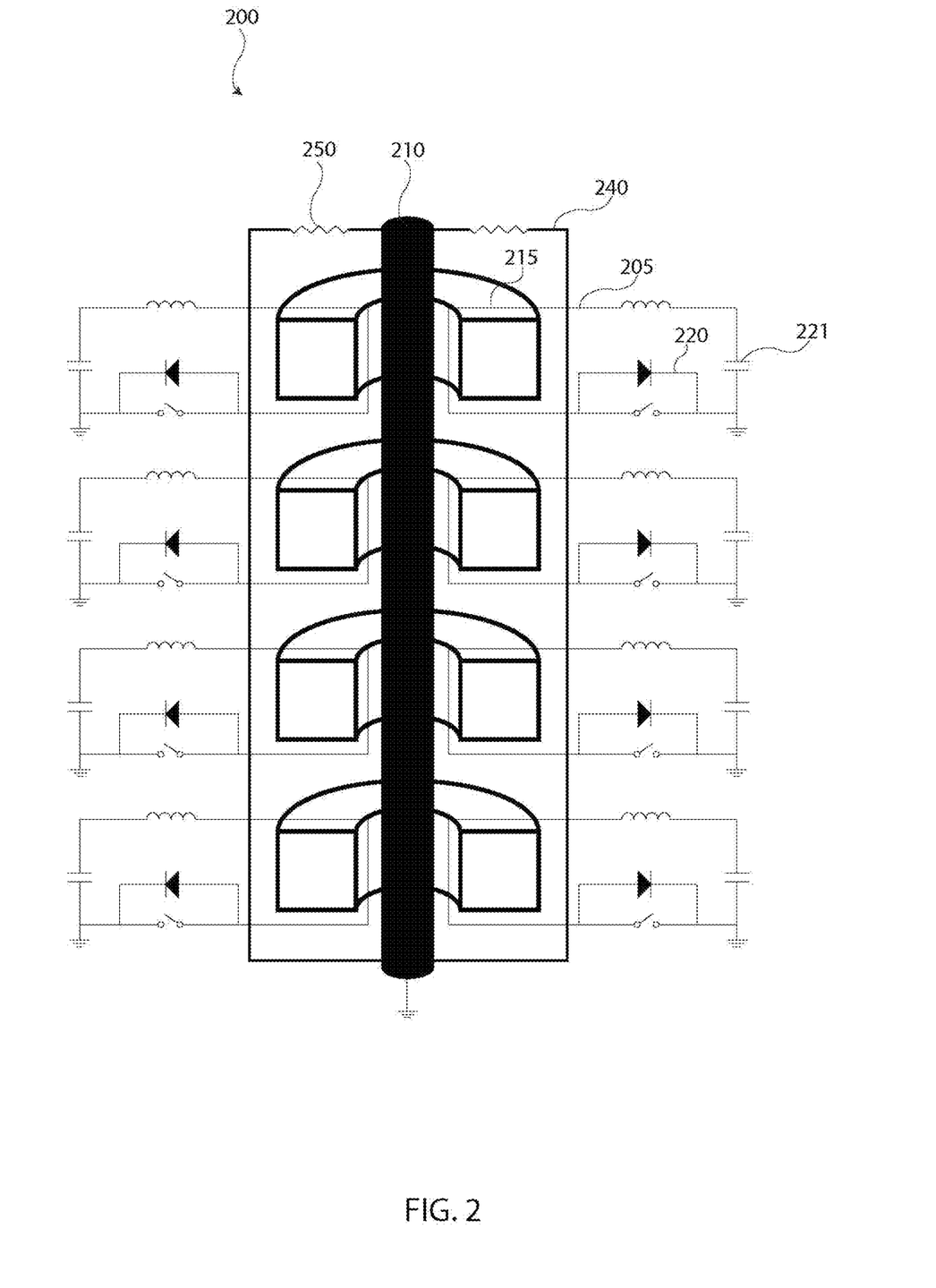
FIG. 2 is an example diagram of a four stage inductive adder power system.
Figure 6:
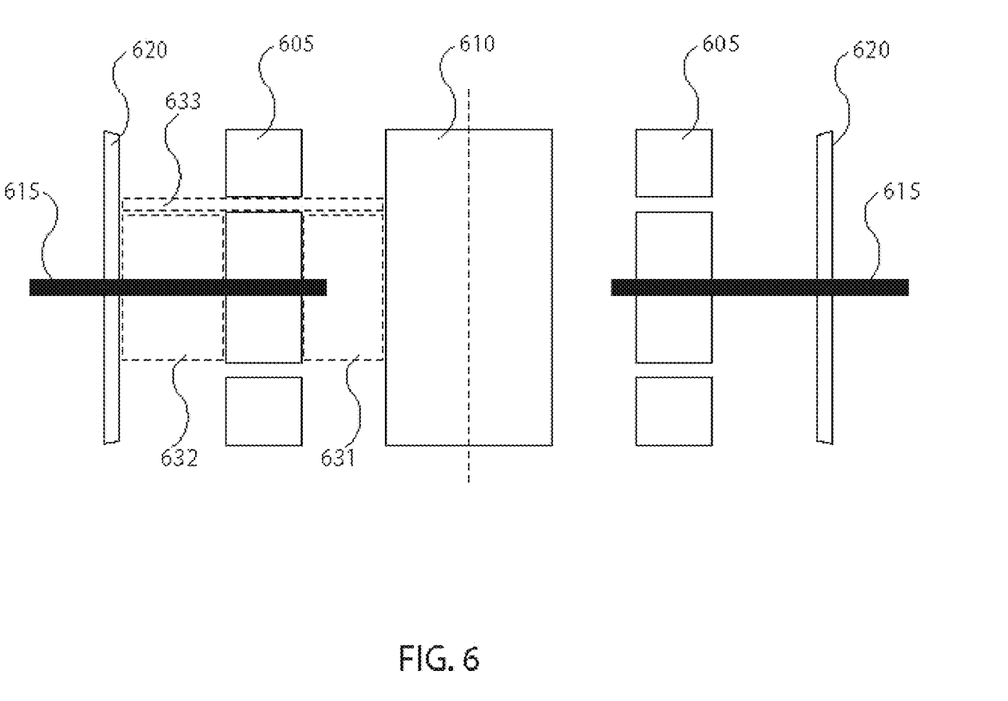
FIG. 6 is an example schematic of a single switch board with a transformer in an inductive adder power supply.

FIG. 2 is an example diagram of a four stage inductive adder power system 200. (e.g., four switch boards). An inductive adder power system 200 may include any number of switch boards. Each switch board, for example, may include a plurality of solid-state switch modules 220. A more detailed example of a solid-state switch module is shown in FIG. 6. Each solid-state switch module 220 may be coupled with an energy storage capacitor 221 and/or a power supply that charges the energy storage capacitor 221, and a one or more primary windings 205.

The inductive adder power system 200 may include a transformer that includes a plurality of transformer cores

215. Each transformer core 215 may be made from a ferrite material and have a toroid shape. The transformer may include a plurality of primary windings 205 wrapped around the transformer core 215. The transformer may also include a transformer secondary that includes a central rod 210 connected to ground on one end and connected to a metal cylinder 240 outside of the plurality of transformer cores 215. A load 250, for example, may be connected between the central rod 210 and the top of the metal cylinder 240.

All of the primaries of the transformer, for example, may be connected in parallel. Whereas the transformer secondary may be connected in series around all the transformer cores. Each switch board may include a plurality of switches and a plurality of primary windings around a single transformer core.

Since each switch module 220 may only contribute a fraction of the output voltage, discrete solid-state switches can be used, which may have maximum voltages in the 600 V-1700 V range. The output voltage may then be proportional to the number of stages in the stack as shown with Faraday's law:

$$V_{out} = -\frac{d\Phi_{B,secondary}}{dt} = -N\frac{d\Phi_{B,primary}}{dt}$$

$$V_{out} = NV_{primary}$$

While each stage only switches a small fraction of the load voltage, for example, each stage may be capable of switching the full load current. This high current, for example, may require many solid-state switches to operate in parallel with low jitter. With a very low inductance design, an inductive adder can drive low impedance loads to high voltages with fast rise times.

Figure 3:
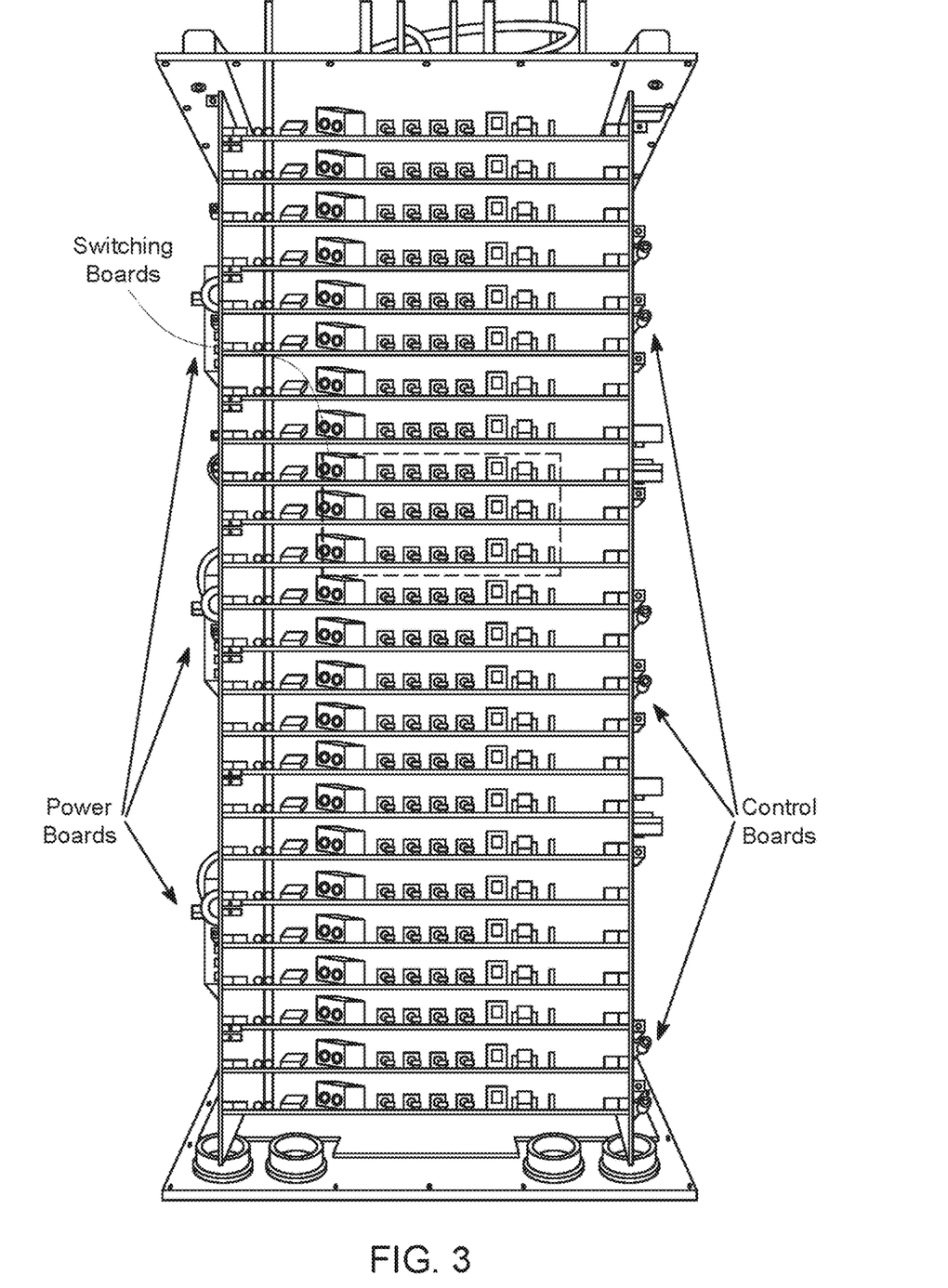
FIG. 3 is an image of an example inductive adder power system with 24 switch boards.

FIG. 3 is an image of an example inductive adder power system with 24 switch boards stacked one on top of another. Each switch board has a plurality of switch modules and a single transformer core. The inductive adder power system may have a single secondary that includes a metal cylinder 240 and a metal rod 210.

An inductive adder power system, for example, may limit the presence of high voltage to the transformer because all circuit components are comparatively low voltage. All switching components, for example, may be ground referenced, which may simplify gate drive design, increases robustness, and/or reduces jitter. Solid-state switches like Metal-Oxide Semiconductor Field-Effect Transistors (MOSFETs), GaN FET, and/or Insulated-Gate Bipolar Transistors (IGBTs), for example, may be used on an inductive adder power system and may allow for user-adjustable pulse widths.

Off-the-shelf components may be used on an inductive adder power system. When newer components become available, these can be replaced to improve performance of future systems. Another potential benefit of an inductive adder power system, for example, may include that a single stage failure (e.g., a failure of a single printed circuit board) may not fail the entire power system. Another potential benefit of an inductive adder power system, for example, may be that the output of an inductive adder power system can be modulated to improve the flattop with the addition of an active or passive modulation stage.

Figure 4A:
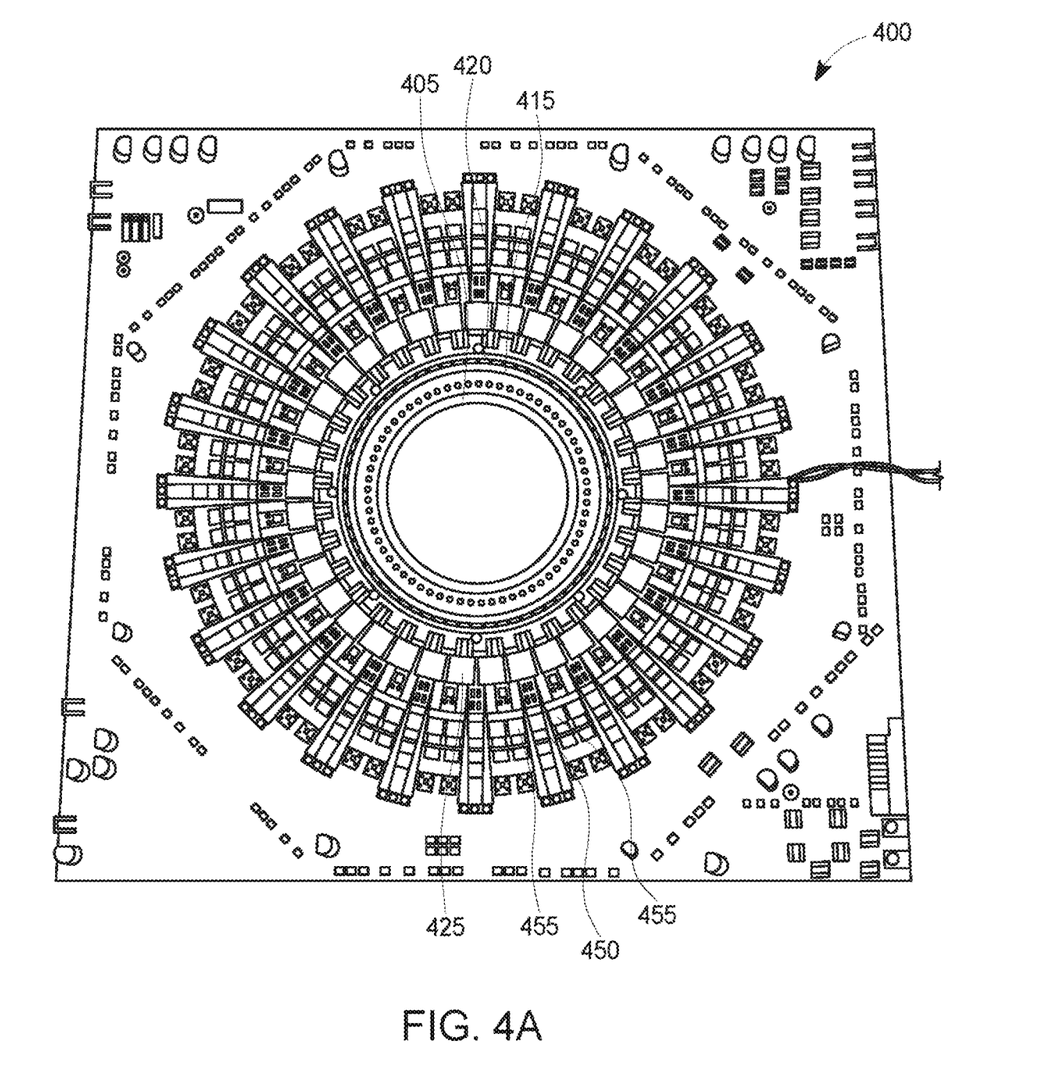
FIG. 4A is an example schematic representation of a switch board.

FIG. 4A is a schematic representation of a switch board 400. The various components are arranged in a circle around a hole in the printed circuit board where the transformer rod extends through the circuit board.

Figure 4B:
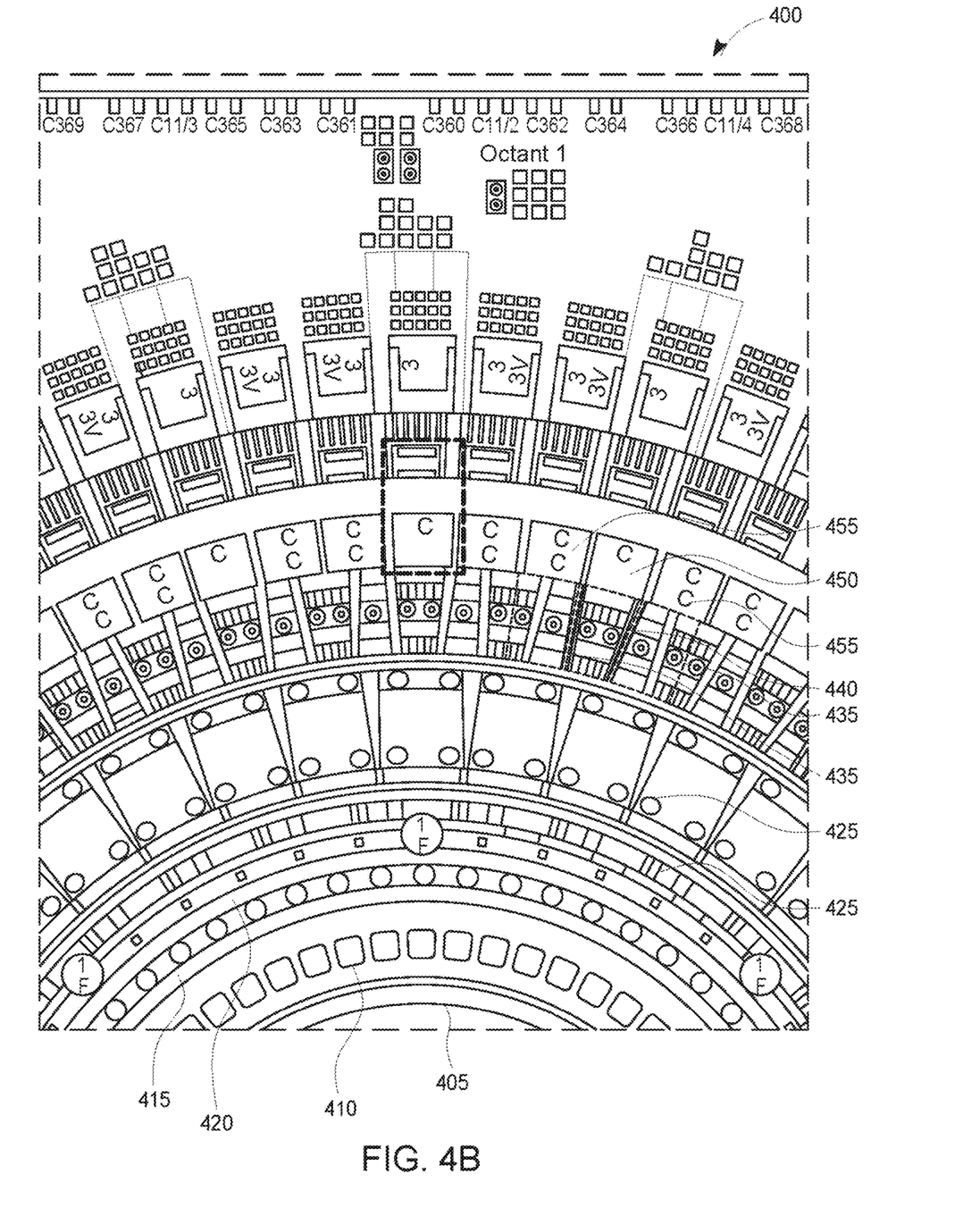
FIG. 4B is an example schematic representation of a portion of the switch board.

FIG. 4B is a schematic representation of a portion of the switch board 400 with a transformer in an inductive adder power supply. FIG. 4B shows the transformer core 410, which is toroidal shaped and centered around the transformer rod. The transformer core 410, for example, may have radius greater than about 1.0", 1.5", 2.0", 2.5", 3.0", 3.5", 5", 7", 10", etc. The transformer rod, for example, may have a radius less than the radius of the transformer core. The transformer rod, for example, may have a radius of about 0.25", 0.5", 0.75", 1.0", 1.5", 2.0", 2.5", 3.0", 3.5", 5", 7", etc.

The primary windings wrap around the transformer core 410 and may be connected to the circuit board at the inner primary pads 405 and outer primary pads 415. The outer cylinder is coupled with the circuit board at the circular arrangement of pads 420. The radius of the outer cylinder, for example, may be 2.5", 3.0", 3.5", 5", 7", 10", etc. The distance between the outer diameter of the transformer core and the outer cylinder, for example, example may be less than about 20 mm, 15 mm, 10 mm, 5 mm, 2.5 mm, 1.0 mm, 0.75 mm, 0.5 mm, 0.25 mm, etc.

The energy storage capacitors 425 may also be arranged in a circle around the transformer. The energy storage capacitors 425, for example, may be fast capacitors. The energy storage capacitors 425, for example, may include two types of capacitors such as, for example, a first fast capacitor having a capacitance less than about 500 nF, 250 nF, 100 nF, 50 nF, 25 nF, etc. and/or a second fast capacitor having a capacitance less than about 1,000 nF, 750 nF, 500 nF, 250 nF, 100 nF, etc. The energy storage capacitors 425, for example, may be disposed in a circle having a radius greater than the radius of the outer cylinder such as, for example, of about 3.0", 3.5", 5", 7", 10", etc.

A plurality of switches may be arranged in a circle around the transformer core. These switches may include solid state switches. These switches may include, for example, the main switches 455 (S1 is FIG. 7) and/or tailbiter switches 450 (S_tailbiter in FIG. 7). The diameter of the circle with the plurality of switches may be about 3.5", 5", 7", 10", 12.5", etc.

A plurality of tailbiter resisters may be disposed between the tailbiter switches 450 and the energy storage capacitors 425 and/or arranged in a circle around the transformer. Crowbar diodes and/or freewheeling diodes may be disposed between the main switches 455 and the energy storage capacitors 425 and/or arranged in a circle around the transformer. A plurality of driver circuits may also be arranged in a circle around the transformer outside the switches 450 and 455.

Figure 5:
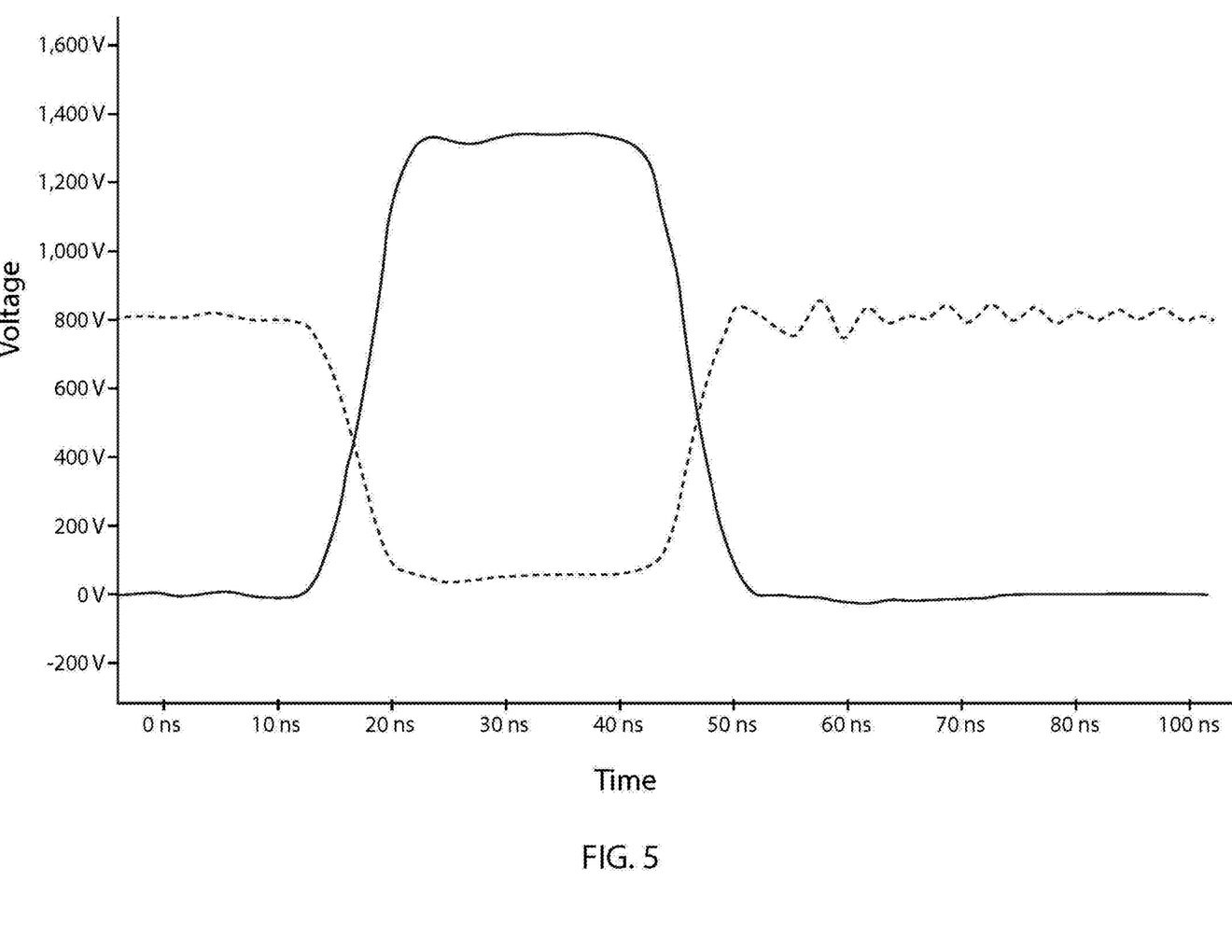
FIG. 5 shows an example of waveforms of voltage across the switches (yellow) and voltage across the 0.625Ω load (blue).

FIG. 5 shows the waveform of voltage across the switches (dashed lines) and voltage across a 0.625Ω load (solid line). In this example, each switch board produces an output voltage of 1.5 kV and had a rise time of 7.2 ns at this voltage level to produce a total output voltage of about 1,400 kV. The full width half max (FWHM) of the minimum pulse width is 24.6 ns with the pulse completely gone after 40 ns.

An inductive adder power system, for example, may produce more than about 50 kV. An inductive adder power system, for example, may include a plurality of switch boards that each output more than about 1.0 kV (e.g., more than about 1.5 kV). Each switch board, for example, may be capable of sourcing the full output current of 1 kA. Each switch board, for example, may include a plurality of solid state switches, a plurality of surface mount energy storage capacitors, and a plurality of surface mount diodes as well as through-hole components.

An inductive adder power system may include a transformer with low stray inductance. To calculate the inductance within a transformer, the transformer can be approximated as a coaxial cable:

$$\frac{L}{h} = \frac{\mu}{2\pi}\ln\left(\frac{D}{d}\right).$$

Where L is the inductance, h is the length, µ is the permeability of the material between the two sides, D is outer diameter, and d is the inner diameter. The capacitance of the transformer can be calculated $$\frac{C}{h} = \frac{2\pi\varepsilon}{\ln\left(\frac{D}{d}\right)}.$$

Where C is the capacitance, and ε is the permittivity of the material between plates.

FIG. 6 is a sideview schematic of an example single switch board 615 with a transformer in an example inductive adder power supply. FIG. 6 shows the transformer core 605 (e.g., ferrite core), the transformer inner rod 610, a switch board 615, and the outer transformer cylinder 620. The area that contributes to the stray inductance and stray capacitance is broken into three components: area 631, area 632, and area 633. Area 631 includes the cross-sectional area between the transformer core 605 and the transformer inner rod 610. Area 632 includes the cross-sectional area between the outer transformer cylinder 620 and the transformer core 605. Area 633 includes the cross-sectional area between transformer cores 605 on different circuit boards.

As shown in FIG. 6, some circuit boards may have components including the transformer core 605 on both the top and bottom of the circuit boards.

Fast rise times can be produced, for example, by reducing the transformer secondary inductance (e.g., at the expense of the transformer stray capacitance). This can be accomplished, for example, by increasing the center diameter of the transformer inner rod 610. The may, however, increase the electric field between the primary and secondary. The transformer may be pressurized with $SF_6$ or another gas to increase the dielectric constant between the primary and secondary. Since the inductance scales as the natural logarithm, there is an optimal point in terms of inductance and safety. A factor of two reduction in spacing of the inner and outer diameters, for example, may result in a 40% reduction in output inductance.

Figure 7:
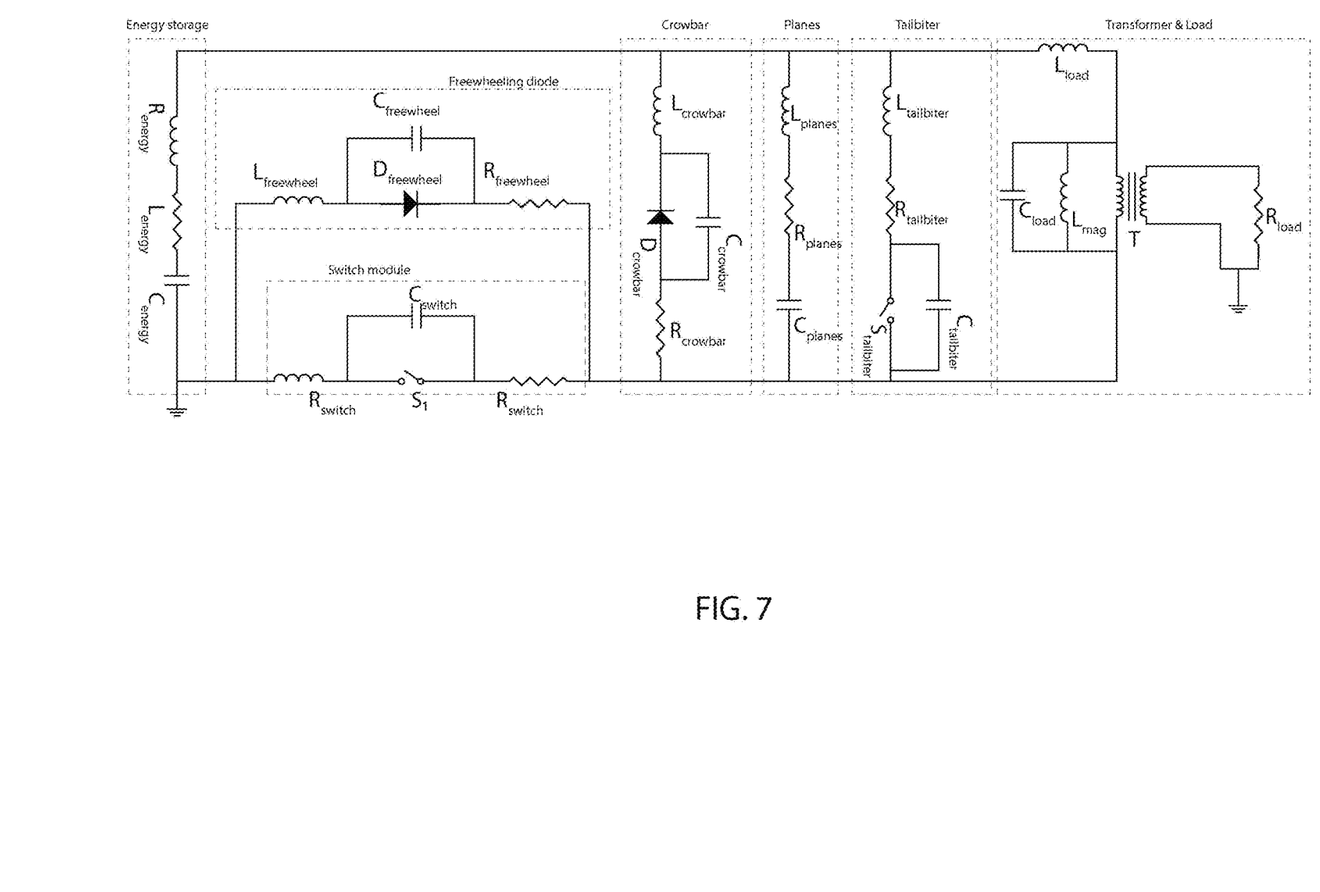
FIG. 7 is an example circuit diagram of a single switch board.

FIG. 7 is an example circuit diagram of a single switch board. This example switch board includes one or more switches with corresponding stray capacitance, inductance, and resistance; a freewheeling diode with corresponding stray capacitance, inductance, and resistance; a crowbar diode with corresponding stray capacitance and stary inductance; the stray capacitance, inductance, and resistance of each switch board (planes), transformer; energy storage components including stray capacitance, inductance, and resistance; a tailbiter circuit with a tailbiter switch including stray capacitance, inductance, and resistance, a load, which in this case is resistive.

The capacitance of various components, such as, for example, diodes, solid state switches, etc., for example, may vary as a function of voltage. The capacitance of various components as listed in this document, such as, for example, diodes, solid state switches, etc., for example, if not stated, are the capacitance value at 0 volts. Alternatively or additionally, the capacitance, inductance, voltage, resistance, etc. values listed in this document unless otherwise specified are values for each switch board.

For each switch board, the stray capacitance of each crowbar circuit of the many crowbar circuits on a switch board, for example, may be less than about 30 nF, 20 nF, 15 nF, 12 nF, 10 nF, 8 nF, 5 nF, 2 nF, etc. such as, for example, at 0 volts. The stray inductance for each crowbar circuit of the many crowbar circuits on a switch board, for example, may be less than about 500 pH, 250 pH, 100 pH, 50 pH, etc.

The inductive adder power system may include a plurality of switch boards where each switch board has a switch board capacitance that is less than about 10 nF, 5 nF, 2 nF, 1 nF, 0.5 nF, 0.25 nF, 0.1 nF, etc. Each switch board, for example, may have a top and bottom spacing from the respective adjacent layer that is greater than 90 mils, 75 mils, 60 mils, 45 mils, 30 mils, 15 mils, etc. Each switch board, for example, may include custom materials within the circuit with a lower dielectric constant such as, for example, a dielectric less than about 5, 4, 3, 2, etc.

The inductive adder power system may include a plurality of switch boards, where each switch boards includes one or more switches such that each switch of the one or more switches on a switch board may have a capacitance less than about 15 nF, 10 nF, 8 nF, 5 nF, 3 nF, 2 nF, 1 nF, 0.5 nF, 0.25 nF, 0.1 nF, 0.075 nF, 0.05 nF, 0.025 nF etc. such as, for example, at 0 volts and/or an inductance less than about 500 pH, 250 pH, 100 pH, 50 pH, etc. The main switches and the tail biter switches may be the same type of switches or different type of switches and/or may have the same or different stray capacitance or stray inductance values. Each switch board, for example, may include more than 5, 10, 25, 50, 75, 100, 125, 150 switches. In a specific example, each switch board may include 96 switches. Each switch may comprise an IGBT, SiC MOSFET, MOSFET, FET, GaN switch, SiC switch, etc. Each switch board, for example, may include a plurality of switches arranged in a circle around the switch board.

The plurality of switches, for example, can be arranged in a circle, octagon, hexagon, polygonal, etc. shape around the primary of the transformer core as shown in FIG. 4.

The inductive adder power system may include a plurality of switch boards, where each switch board includes a tailbiter circuit as shown in FIG. 7. The tailbiter circuit, for example, may include one or more tailbiter switches (S_tailbiter) parallel with the load. The tailbiter switch (S_tailbiter), for example, can be closed at the end of a pulse and may be used to discharge the load and/or the plane capacitance to ground. The tailbiter circuit is shown with tailbiter stray capacitance (C_tailbiter) and tailbiter stray inductance (L_tailbiter).

The tailbiter stray capacitance (C_tailbiter), for example, for each switch, may have a capacitance less than about 15 nF, 10 nF, 8 nF, 5 nF, 3 nF, 2 nF, 1 nF, 0.5 nF, 0.25 nF, 0.1 nF, 0.075 nF, 0.05 nF, 0.025 nF etc. such as, for example, at 0 volts. The tailbiter stray inductance (L_tailbiter), for each switch, for example, may have an inductance less than about 1,000 pH, 500 pH, 250 pH, 100 pH, 50 pH, etc.

The tailbiter circuit, for example, may produce a faster fall time.

A tailbiter resistor (R tailbiter) may be added to the tailbiter circuit that may, for example, be used to adjust the RC time constant, reduce ringing, and/or limit the current in the one or more tailbiter switches (S_tailbiter). Each switch board may include a plurality of main switches (S1) associated with a single tailbiter switch such as, for example, two main switches for every tailbiter switch. The tailbiter resistor, for example, may have a resistance less than about 1,000 mΩ, 500 mΩ, 250 mΩ, 100 mΩ, 50 mΩ, etc.

The inductive adder power system may include an output stray inductance (L_load) that may have an inductance that is less than about 10 pH, 5 pH, 2 pH, 1 pH, 0.5 pH, 0.1 pH etc. The output stray inductance, for example, may be reduced by changing the distance between the central core and the outer transformer cylinder. The output stray inductance, for example, may be reduced by including adding a gas (e.g., $SF_6$) between the transformer core and the outer transformer cylinder.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. An inductive adder comprising:
   a plurality of switch boards, each of the plurality of switch boards comprising a plurality of solid state switches, the plurality of switch boards stacked one upon another;
   a transformer comprising:
      a plurality of toroid-shaped transformer cores disposed on a corresponding one of the plurality of switch boards; and
      a transformer rod that extends through the plurality of switch boards and the plurality of transformer cores; and
   an output electrically coupled with the transformer rod;
   wherein the each of the plurality of circuit boards include a tailbiter circuit electrically coupled in parallel with the output.

2. The inductive adder according to claim 1, wherein each of the plurality of tailbiter circuits comprises a tailbiter switch and a tailbiter resistor.

3. The inductive adder according to claim 2, wherein the tailbiter resistor has a resistance less than about 1,000 mΩ.

4. The inductive adder according to claim 1, wherein each of the plurality of solid state switches comprise a plurality of SiC switches.

5. The inductive adder according to claim 1, wherein each switch board comprises a plurality of layers, at least one of the plurality of layer has a dielectric constant lower than about 4.

6. The inductive adder according to claim 1, wherein each switch board capacitance less than about 5 nF.

7. The inductive adder according to claim 1, wherein each switch board comprises a plurality of layers with a top to bottom spacing between respective adjacent layers to be more than about 60 mils.

8. The inductive adder according to claim 1, further comprising an output stray inductance less than about 10 pH.

9. The inductive adder according to claim 1, wherein each of the plurality of plurality of switch boards produce an output greater than 1.0 kV.

10. The inductive adder according to claim 1, wherein each of the plurality of switches on a corresponding switch board of the plurality of switch boards are arranged in a circle around the toroid-shaped transformer core.

11. An inductive adder comprising:
   a plurality of switch boards, each of the plurality of switch boards comprising a plurality of solid state switches, the plurality of switch boards stacked one upon another, and each of the plurality of plurality of switch boards produce an output greater than 1.0 kV;
   a transformer comprising:
      a plurality of toroid-shaped transformer cores disposed on the plurality of switch boards; and
      a transformer rod that extends through the plurality of switch boards and the plurality of transformer cores;
   an output electrically coupled with the transformer rod; and
   an output stray inductance less than about 10 pH;
   wherein the each of the plurality of circuit boards include a tailbiter circuit electrically coupled in parallel with the output, each of the plurality of tailbiter circuits comprises a tailbiter switch and a tailbiter resistor.

12. The inductive adder according to claim 11, wherein each of the plurality of solid state switches comprise a plurality of SiC switches.

13. The inductive adder according to claim 11, wherein each switch board comprises a plurality of layers, at least one of the plurality of layer has a dielectric constant lower than about 4.

14. The inductive adder according to claim 11, wherein each of the plurality of switches on a corresponding switch board of the plurality of switch boards are arranged in a circle around the toroid-shaped transformer core.

15. An inductive adder comprising:
   a plurality of switch boards, each of the plurality of switch boards comprising a plurality of solid state switches, the plurality of switch boards stacked one upon another, wherein each switch board comprises a plurality of layers, at least one of the plurality of layer has a dielectric constant lower than about 4;

a transformer comprising:
- a plurality of toroid-shaped transformer cores disposed on the plurality of switch boards; and
- a transformer rod that extends through the plurality of switch boards and the plurality of transformer cores; and an output electrically coupled with the transformer rod.

16. The inductive adder according to claim 15, wherein the each of the plurality of circuit boards include a tailbiter circuit electrically coupled in parallel with the output.

17. The inductive adder according to claim 16, wherein each of the plurality of tailbiter circuits comprises a tailbiter switch and a tailbiter resistor.

18. The inductive adder according to claim 15, wherein each of the plurality of solid state switches comprise a plurality of SiC switches.

19. The inductive adder according to claim 15, further comprising an output stray inductance less than about 10 pH.

20. The inductive adder according to claim 15, wherein each of the plurality of plurality of switch boards produce an output greater than 1.0 kV.

21. The inductive adder according to claim 15, wherein each of the plurality of switches on a corresponding switch board of the plurality of switch boards are arranged in a circle around the toroid-shaped transformer core.

* * * * *